United States Patent

Wang et al.

[11] Patent Number: 6,117,757
[45] Date of Patent: Sep. 12, 2000

[54] METHOD OF FORMING LANDING PADS FOR BIT LINE AND NODE CONTACT

[75] Inventors: Chuan-Fu Wang, Taipei Hsien; Benjamin Szu-Min Lin, Chiayi, both of Taiwan

[73] Assignee: United Microelectronics Corp, Hsinchu, Taiwan

[21] Appl. No.: 09/164,966

[22] Filed: Oct. 1, 1998

[30] Foreign Application Priority Data

Jun. 29, 1998 [TW] Taiwan ................................ 87110438

[51] Int. Cl.$^7$ .................... H01L 21/3205; H01L 21/4763
[52] U.S. Cl. ............................. 438/596; 438/597
[58] Field of Search .................... 257/906, 907, 257/908; 438/596, 597

[56] References Cited

U.S. PATENT DOCUMENTS

| 4,997,970 | 3/1991 | Woo et al. ............................. 438/586 |
| 5,705,427 | 1/1998 | Chan et al. ............................. 438/612 |
| 5,902,132 | 5/1999 | Mitsuhashi ............................. 438/666 |

*Primary Examiner*—Richard Elms
*Assistant Examiner*—Christian D. Wilson
*Attorney, Agent, or Firm*—Jiawei Huang; J.C. Patents

[57] ABSTRACT

A method of forming landing pads for a bit line and a node contact is provided. First, a first dielectric layer is formed on a substrate having a transistor structure thereon. The first dielectric layer is defined and etched in a self-aligned process to form a contact opening to the substrate. A second dielectric layer is formed on the first dielectric layer and is etched back to form a spacer on the opening sidewall. Then, a conductive layer is formed on the first dielectric layer and fills the opening. A bit line is formed by partially removing the conductive layer through a photo-resist mask provided on the conductive layer, wherein the conductive layer filling the opening is left to form a landing pad.

10 Claims, 4 Drawing Sheets

METHOD OF FORMING LANDING PADS FOR BIT LINE AND NODE CONTACT

CROSS-REFERENCE TO RELATED APPLICATION

This application claims the priority benefit of Taiwan application Ser. No. 87110438, filed June 29, 1998, the full disclosure of which is incorporated herein by reference.

BACKGROUND OF THE INVENTION

1. Field of the Invention

The invention relates in general to the fabrication of semiconductor integrated circuits (ICs), and more particularly to a method of forming landing pads.

2. Description of the Related Art

Currently, the line width of the semiconductor fabrication process is already at the sub-micron level. Reducing the line width of the fabrication process is an approach to improve the efficiency of a semiconductor device, and reduce the fabrication cost as well. Downsizing a semiconductor device can be partially accomplished by improving the resolution of some fabrication processes, such as photolithography dry etching processes. More advanced exposure equipment and more sensitive photo-resists are certainly required for a sub-micron photolithography process.

Additionally, more precise and advanced etching equipment and methods are also used for more correctly and successfully transferring patterns. Although developing advanced equipment and methods help to downsize a semiconductor device, the task is still mainly dependent on minimizing the structure of a semiconductor device.

For example, in order to reduce the size of a semiconductor device, a conducting structure that is used to connect a bit line or a node in an upper layer of the source/drain regions of a transistor of a lower layer, has to be reduced in size. Methods according to the foregoing goal have been developed and used, wherein the methods include placing a narrow polysilicon plug between the bit line and the source/drain regions underneath. However, forming a narrow polysilicon plug on the source/drain regions and then forming a bit line over the polysilicon plug requires very precise photolithography processes that are difficult to accomplish when line width is at the sub-micron level.

FIGS. 1A to 1E are cross-sectional views of a semiconductor device showing a conventional structure of landing pads.

FIG. 1A shows a substrate 100 which contains a transistor 108 consisting of a gate 102, an insulating layer 104 and a spacer 106. A first dielectric layer 110, such as a silicon dioxide layer is formed over entire substrate 100.

FIG. 1B illustrates definition of the first dielectric layer 110 by a photolithography process. A contact opening (not shown) is formed in the first dielectric layer 110 by etching to expose the substrate 100. Then, a first conductive layer 112 is formed over the first dielectric layer 110 and fills the contact opening.

Next, as illustrated in FIG. 1C, the first conductive layer 112 is partially removed to expose the surface of the first dielectric layer 110 and to form landing pads 113 which have a top surface lower than the first dielectric layer 110 in the contact opening. The step is performed by etching back the conductive layer 112.

FIG. 1D illustrates formation of a second dielectric layer 114, such as a silicon dioxide layer, over the first dielectric layer 110 and the landing pads 113.

FIG. 1E illustrates definition of the second dielectric layer 114, which is then partially removed to form a via 116 in it and to expose one of the landing pads 113. A second conductive layer (not shown) is formed over the second dielectric layer 114 and defined to form a bit line 118 coupling with the exposed landing pad 113 through the via 116.

The landing pad patterns are separated by a certain distance. Downsizing a semiconductor device is limited by photolithography resolution. Since the distance between landing pads generally cannot be shorter than 0.22 $\mu$m, the size of a landing pad is limited and generally cannot be increased. The limit of the landing pad size makes the more difficult.

Furthermore, some of the landing pads 113 connecting to the substrate 100 are used as bit lines, and other landing pads 113 are used as nodes and are connected to conductors during back-ending processes. Forming the nodes comprises a step of depositing a third dielectric layer over the bit lines and a step of using a photolithography process to form vias as node contacts to the other landing pads through the second and the third dielectric layer.

It will be appreciated that the structure formed by the method described above is relatively high, and the node contact vias must be formed standing off the first and the second conductive layers. This makes the process more difficult. On the other hand, masks used to form vias must have a higher alignment during photolithography processes. This means that those processes have a poor tolerance of alignment deviation.

SUMMARY OF THE INVENTION

It is therefore the major object of the invention to provide an improved and simplified method of forming landing pads for bit lines and node contacts. In accordance with the invention, the bit lines and the node contacts are formed simultaneously by defining and etching a conductive layer. The method can reduce a device size for only needing a layer of dielectric layer. The method also can enhance the tolerance of aligned deviation by forming a spacer on a contact opening sidewall after forming the contact opening.

The invention achieves the above-identified objects by providing a method of forming landing pads for a bit line and a node contact. First, a first dielectric layer is formed on a substrate having a transistor structure thereon. The first dielectric layer is defined and etched in a self-aligned process to form a contact opening to the substrate. A second dielectric layer is formed on the first dielectric layer and is etched back to form a spacer on the sidewall of the opening. Then, a conductive layer is formed on the first dielectric layer and fills the opening. A bit line is formed by partially removing the conductive layer through a photo-resist mask provided on the conductive layer, wherein the conductive layer fills the opening and is left to form a landing pad.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
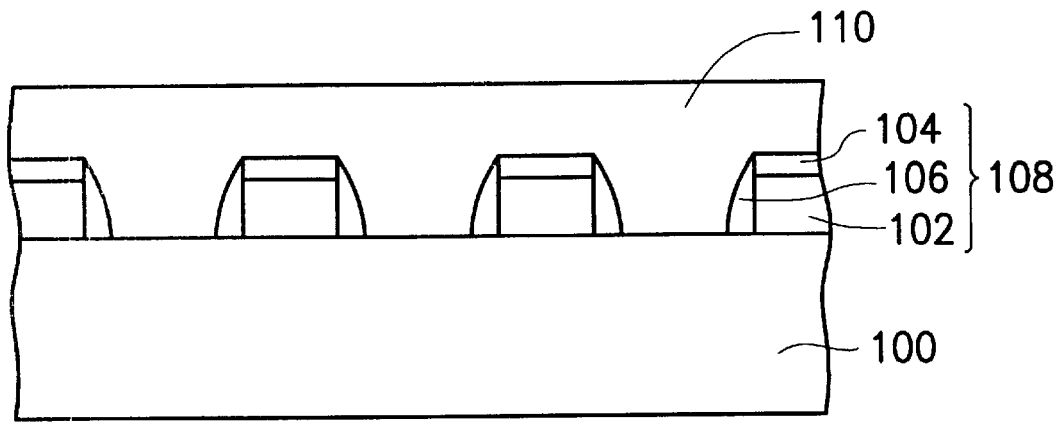
FIGS. 1A to 1E are cross-sectional views of a semiconductor device showing a conventional landing pad structure.
Figure 1B:
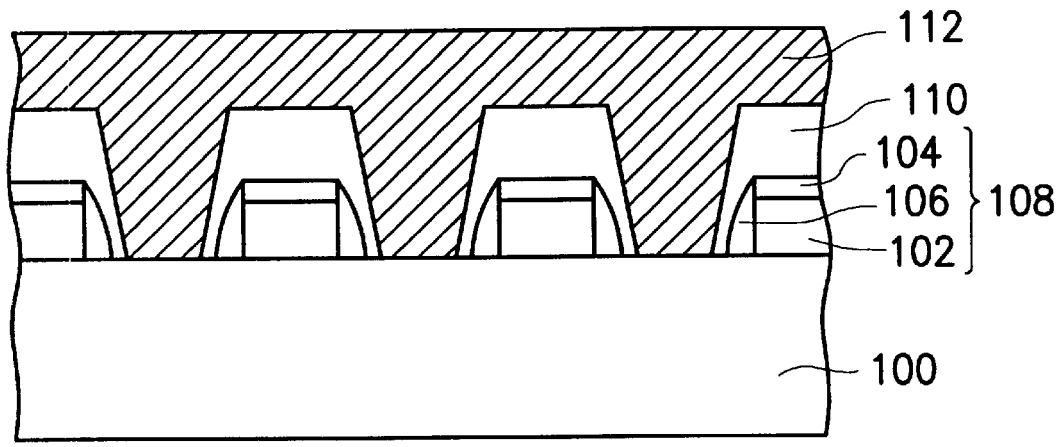
Figure 1C:
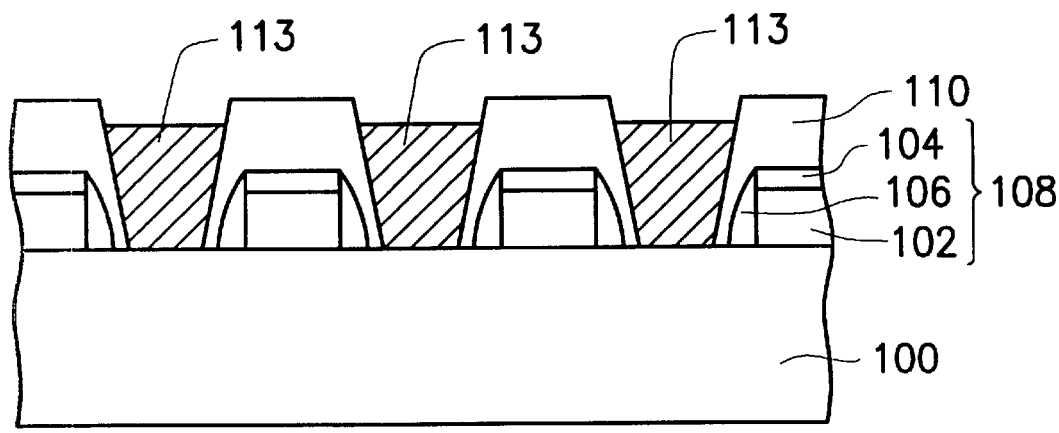
Figure 1D:
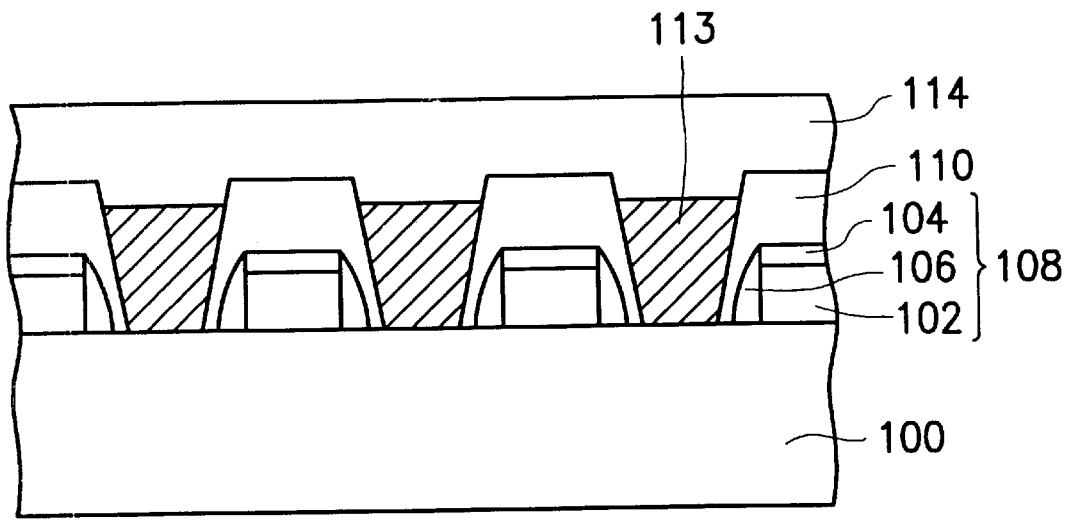
Figure 1E:
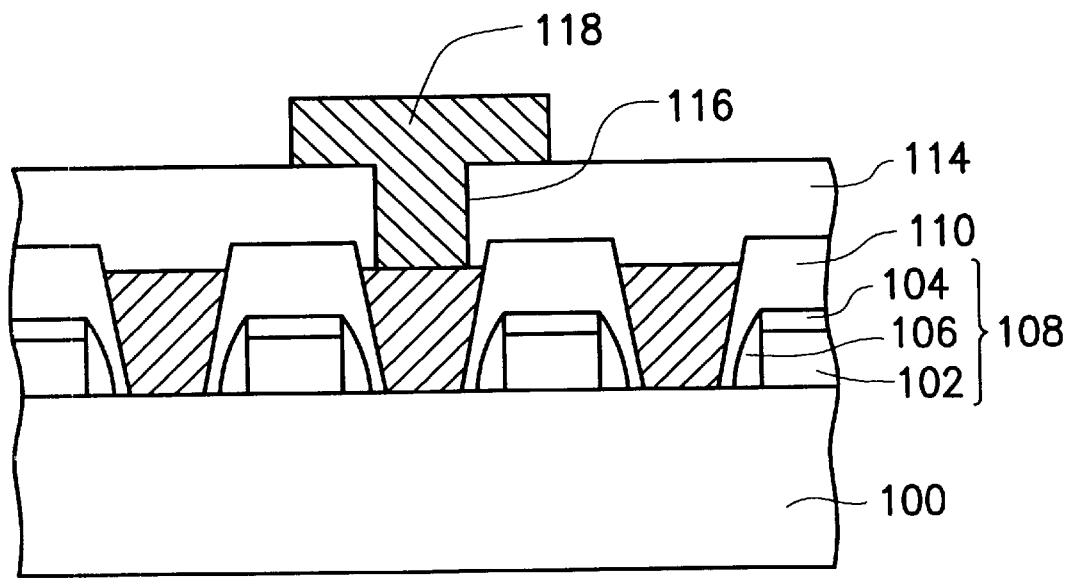
Figure 2A:
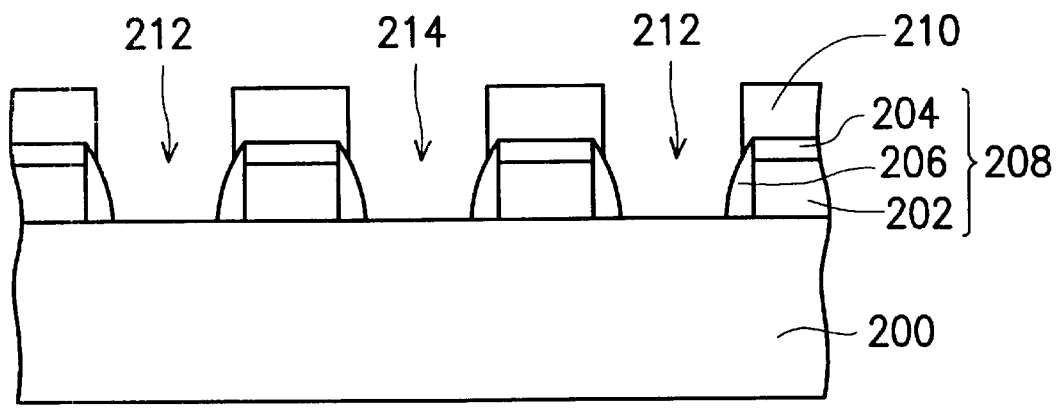
FIGS. 2A to 2E are cross-sectional views of a semiconductor device showing the process steps of one preferred embodiment of the method of forming landing pads for a bit line and a node contact.

First, as shown in FIG. 2A, a substrate 200 is provided. There is at least one transistor 208 including a gate 202, an insulating layer 204 and a first spacer 206 formed on the substrate 200. A dielectric layer 210, such as silicon dioxide is formed over the substrate 200. The dielectric layer 210 is defined and is partially removed, for example, to form a node contact opening 212 and a bit line contact opening 214.

Figure 2B:
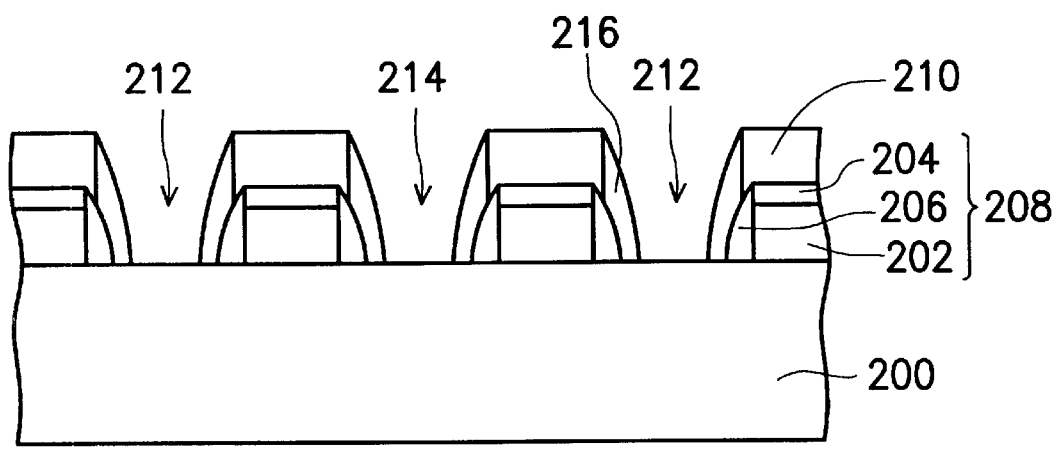

FIG. 2B illustrates formation of second spacers 216 on the node contact opening 212 sidewall and on the bit line contact opening sidewall. The spacers 216 are formed by depositing a thin silicon oxide layer (not shown) on the structure shown in FIG. 2A and etching back the thin silicon oxide layer until the top surface of the dielectric layer 210 is exposed.

Figure 2C:
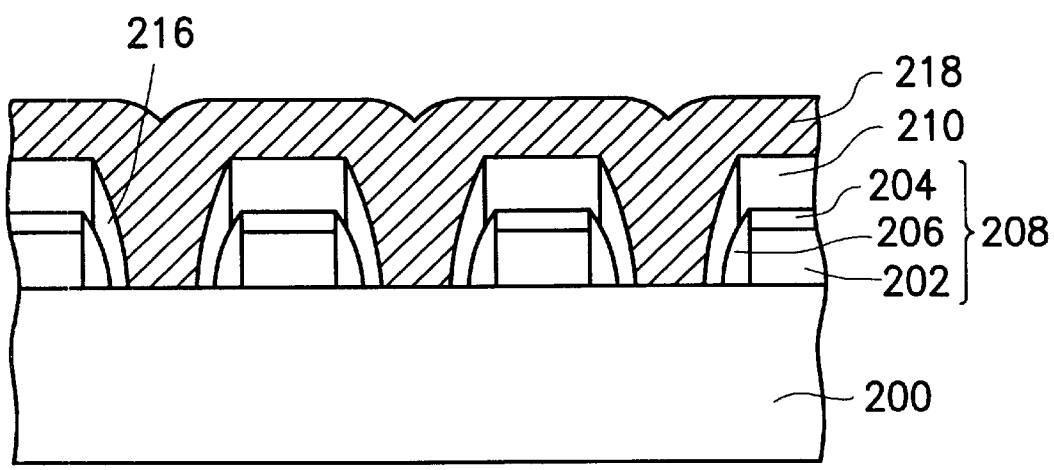

In FIG. 2C, a conductive layer 218 is formed on the dielectric layer 210 and fills the node contact opening 212 and the bit line contact opening 214. The material of the conductive layer 218 comprises polysilicon or conductive metal.

Figure 2D:
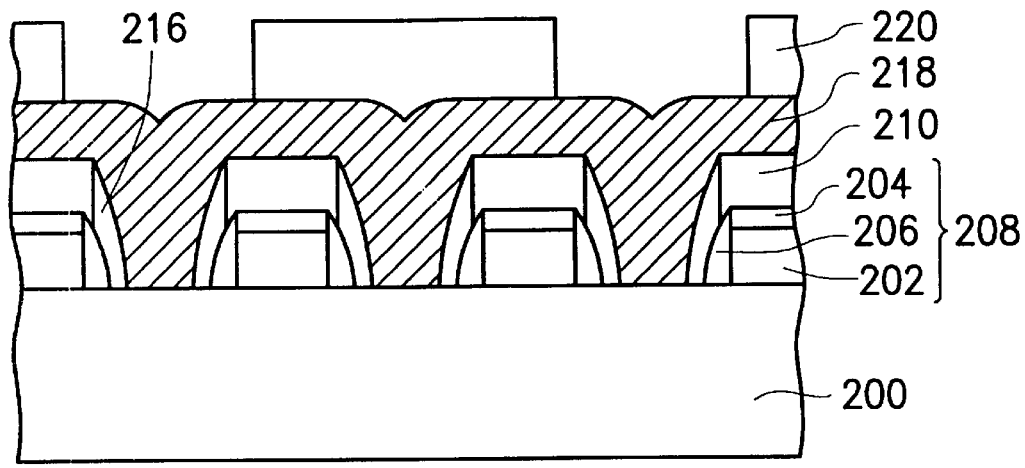

In FIG. 2D, a photo-resist mask 220 whose opening is set to the node contact opening 212 is provided on the conductive layer 218.

Figure 2E:
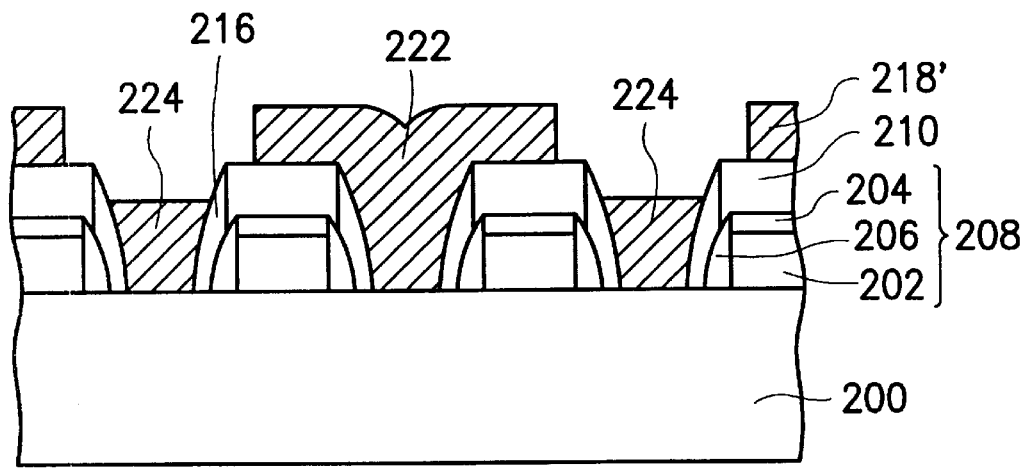

Then, in FIG. 2E, the conductive layer 218 is partially removed, through the photo-resist mask 220, until part of the dielectric layer 210 is exposed. A landing pad 224 fills into the node contact opening 212 during this etching step. The mask 220 is removed after the etching step. A part of the conductive layer 218 filled into the bit line contact opening 214 still remains as a bit line 222.

Figure 2F:
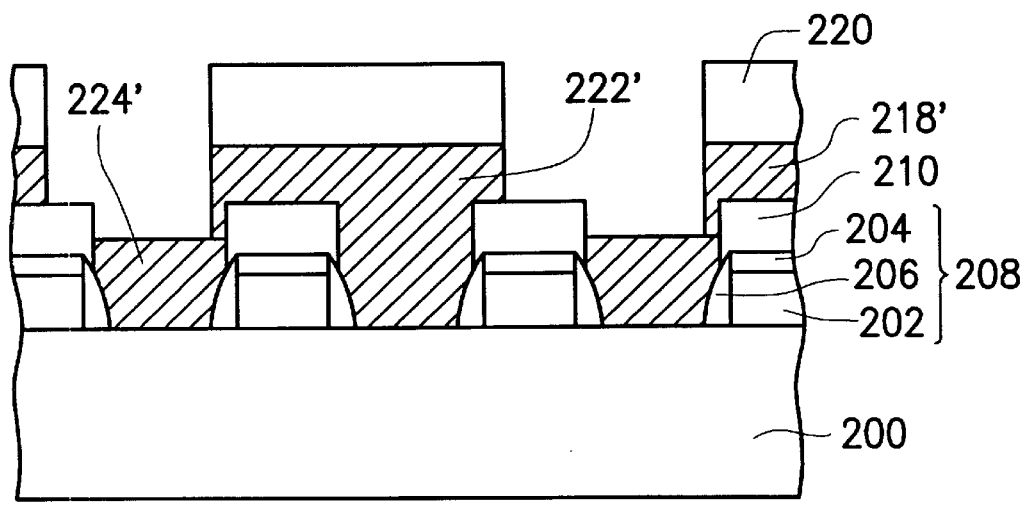
FIG. 2F is a cross-sectional view of a semiconductor device showing a bit line making contact with the node contact because the mask misaligns in the absence of a second spacer.

If there is no second spacer 216 on the contact opening sidewall, the bit line 222' may make contact with landing pad 224' and make node contact, which gives rise to shorts. As shown in FIG. 2F, the photo-resist mask 220 is not aligned. The conductive layer 218' between the bit line 222' and the landing pad 224' for node contact is residual and causes the bit line 222' and the landing pad 224' make contact with each other.

Therefore, the invention forms spacers on the contact opening sidewalls after etching the node contact opening and the bit line contact opening. The spacers increase tolerance of process misalignment. Furthermore, the landing pad for node contact and the bit line are simultaneously formed in the same photolithography and etching step. The invention provides a method that does not add any more dielectric layers. This reduces device size and effectively decreases the cost.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming landing pads for a node contact and a bit line contact performed on a substrate which at least has a transistor formed thereon, the transistor having a gate structure, the method comprising the steps of:

forming a dielectric layer over the substrate;

forming a plurality of contact openings in the dielectric layer to expose the substrate, wherein the contact openings also expose a portion of sidewalls of the gate structure;

forming a spacer on sidewalls of the contact openings;

forming a conductive layer on the dielectric layer and in the contact openings;

forming a photoresist mask on the conductive layer, which is also above the contact openings desired for use of forming a bit line subsequently; and using the photoresist mask as an etching mask, performing an etching process to remove a top portion of the conductive layer until the dielectric layer is exposed, so as to form the bit line and a landing pad for the node contact in the contact openings, wherein the bit line and the landing pad are isolated by the dielectric layer and the spacer.

2. The method according to claim 1, wherein the dielectric layer comprises silicon dioxide.

3. The method according to claim 1, wherein the spacer comprises silicon dioxide.

4. The method of according to claim 3, wherein the step of forming the spacer further comprises:

forming an oxide layer on the dielectric layer and in the contact openings; and partially removing the oxide layer until exposing the dielectric layer surface to form the spacer on the contact openings.

5. The method according to claim 4, wherein the oxide layer is removed by etching back.

6. The method according to claim 1, wherein the conductive layer comprises polysilicon.

7. The method according to claim 1, wherein the conductive layer comprises conductive metal.

8. The method according to claim 1, wherein the contact openings are formed by self-aligned etching.

9. A method of forming landing pads for a node contact and a bit line contact, the method comprising the steps of:

providing a substrate, on which there is at least a transistor with a gate structure formed;

forming a dielectric layer over the substrate;

forming a plurality of contact openings by a self-aligned process, in the dielectric layer to expose the substrate, wherein the contact openings also expose a portion of sidewalls of the gate structure;

forming an oxide layer on the dielectric layer;

partially removing the oxide layer to respectively form a spacer on sidewalls of the contact openings;

forming a polysilicon layer on the dielectric layer and in the contact openings; and partially removing the conductive layer to form a bit line and a landing pad for the node contact in the contact openings, wherein the bit line and the landing pad are isolated by the dielectric layer and the spacer.

10. The method according to claim 9, wherein the oxide layer is removed by etching back.

* * * * *